(12) United States Patent
Nasu et al.

(10) Patent No.: US 10,834,818 B2
(45) Date of Patent: Nov. 10, 2020

(54) WIRING BOARD

(71) Applicant: NGK SPARK PLUG CO., LTD., Nagoya (JP)

(72) Inventors: Takakuni Nasu, Nagoya (JP); Kengo Tanimori, Nagoya (JP); Yousuke Kondo, Nagoya (JP); Masahiro Kamegai, Nagoya (JP); Kouta Kimata, Nagoya (JP); Junya Matsura, Nagoya (JP); Fumio Shiraki, Nagoya (JP); Guangzhu Jin, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/585,021

(22) Filed: Sep. 27, 2019

(65) Prior Publication Data

US 2020/0146146 A1     May 7, 2020

(30) Foreign Application Priority Data

Nov. 5, 2018 (JP) .............................. JP2018-208186
Apr. 12, 2019 (JP) .............................. JP2019-076507

(51) Int. Cl.
| | |
|---|---|
| *H05K 1/11* | (2006.01) |
| *H01L 23/00* | (2006.01) |
| *H01L 23/14* | (2006.01) |
| *H01L 23/48* | (2006.01) |
| *H01L 23/52* | (2006.01) |
| *G01R 1/073* | (2006.01) |

(52) U.S. Cl.
CPC .......... *H05K 1/116* (2013.01); *G01R 1/07307* (2013.01); *H05K 1/119* (2013.01); *H05K 2201/09481* (2013.01)

(58) Field of Classification Search
CPC .......... H05K 1/11; H05K 1/113; H05K 1/025; H05K 1/0243; H01L 23/00; H01L 23/14; H01L 23/48; H01L 23/52
USPC ....... 174/262, 68.1, 250, 261; 257/734, 737, 257/778
See application file for complete search history.

(56) References Cited

U.S. PATENT DOCUMENTS

| | | | | |
|---|---|---|---|---|
| 5,929,521 | A * | 7/1999 | Wark ................. | G01R 1/06738 257/692 |
| 6,940,179 | B2 * | 9/2005 | Lee ........................ | H05K 1/112 257/738 |
| 9,263,408 | B2 * | 2/2016 | Detalle .................... | H01L 24/14 |
| 9,871,013 | B2 * | 1/2018 | Tsai ...................... | H01L 23/147 |
| 10,157,874 | B2 * | 12/2018 | Tsai .................. | H01L 23/49827 |

(Continued)

FOREIGN PATENT DOCUMENTS

| | | |
|---|---|---|
| JP | 2009-74823 A | 4/2009 |
| JP | 2017-63121 A | 3/2017 |

*Primary Examiner* — Xiaoliang Chen
(74) *Attorney, Agent, or Firm* — Stites & Harbison, PLLC; Jeffrey A. Haeberlin; Gary N. Stewart

(57) ABSTRACT

A wiring board includes: an insulator layer composed mainly of ceramic; a conductor extending through the insulator layer in a thickness direction thereof; and an electrode pad disposed on a first surface of the insulator layer and connected electrically with the conductor, wherein: the electrode pad includes through holes extending through the electrode pad in a thickness direction thereof; and each of the through holes is positioned to avoid overlapping with the conductor in the thickness direction of the insulator layer.

4 Claims, 4 Drawing Sheets

(56) References Cited

U.S. PATENT DOCUMENTS

| | | | | |
|---|---|---|---|---|
| 10,433,421 B2* | 10/2019 | Zhang | ................... | H05K 1/113 |
| 2004/0070079 A1* | 4/2004 | Huang | ................... | H01L 24/05 |
| | | | | 257/778 |
| 2006/0091536 A1* | 5/2006 | Huang | ................... | H01L 24/05 |
| | | | | 257/734 |
| 2006/0237855 A1* | 10/2006 | Kroehnert | ......... | H01L 23/49816 |
| | | | | 257/779 |
| 2008/0268637 A1* | 10/2008 | Inaba | ...................... | H01B 1/22 |
| | | | | 438/660 |
| 2009/0315656 A1* | 12/2009 | Wada | ....................... | H01P 1/36 |
| | | | | 335/296 |
| 2010/0200815 A1* | 8/2010 | Inaba | ...................... | H01B 1/22 |
| | | | | 252/500 |
| 2013/0180771 A1* | 7/2013 | Freitag | ................... | H05K 1/11 |
| | | | | 174/261 |
| 2014/0174808 A1* | 6/2014 | Zhang | ................... | H05K 1/113 |
| | | | | 174/261 |
| 2015/0014848 A1* | 1/2015 | Lin | ......................... | H01L 24/81 |
| | | | | 257/737 |
| 2015/0179621 A1* | 6/2015 | Matsumoto | ............ | H01L 25/16 |
| | | | | 257/737 |
| 2019/0273030 A1* | 9/2019 | Lim | .................. | H01L 23/49838 |

* cited by examiner

WIRING BOARD

BACKGROUND

The present disclosure relates to a wiring board.

Japanese Patent Application Publication 2009-74823 discloses a wiring board including a ceramic insulator layer and an electrode pad, wherein the electrode pad is disposed on a surface of the ceramic insulator layer for connection with a terminal of a probe etc., and is electrically connected to a conductor (a so-called via) extending through the ceramic insulator layer.

SUMMARY

FIG. 4 is a schematic cross-sectional view of a conventional wiring board. As shown in FIG. 4, a ceramic insulator layer 102 includes in its surface a void V formed due to expansion and contraction of ceramic upon firing. The void V is likely to catch a residue such as: plating pretreatment liquid used for formation of wiring including an electrode pad 104; and a product of reaction between the plating pretreatment liquid and a conductor 103.

Such residue may cause a problem: in case that the electrode pad 104 is formed over the void V containing the residue, the residue would vaporize and cause a bulge in the electrode pad 104, through a heating process such as: a curing of ceramic layers stacked with the ceramic insulator layer 102; and a blazing or soldering of components to the wiring board.

The bulge may cause insufficient electrical connection between the electrode pad 104 and the conductor 103, wherein the conductor 103 extends through the ceramic insulator layer 102. In other words, the bulge may reduce reliability of connection involving the electrode pad 104.

In view of the foregoing, it is desirable to provide a wiring board improved in reliability of connection involving an electrode pad disposed on a surface of a ceramic insulator layer.

According to one aspect of the present disclosure, a wiring board comprises: an insulator layer composed mainly of ceramic; a conductor extending through the insulator layer in a thickness direction thereof; and an electrode pad disposed on a first surface of the insulator layer and connected electrically with the conductor, wherein: the electrode pad includes through holes extending through the electrode pad in a thickness direction thereof; and each of the through holes is positioned to avoid overlapping with the conductor in the thickness direction of the insulator layer.

DETAILED DESCRIPTION

Figure 1:
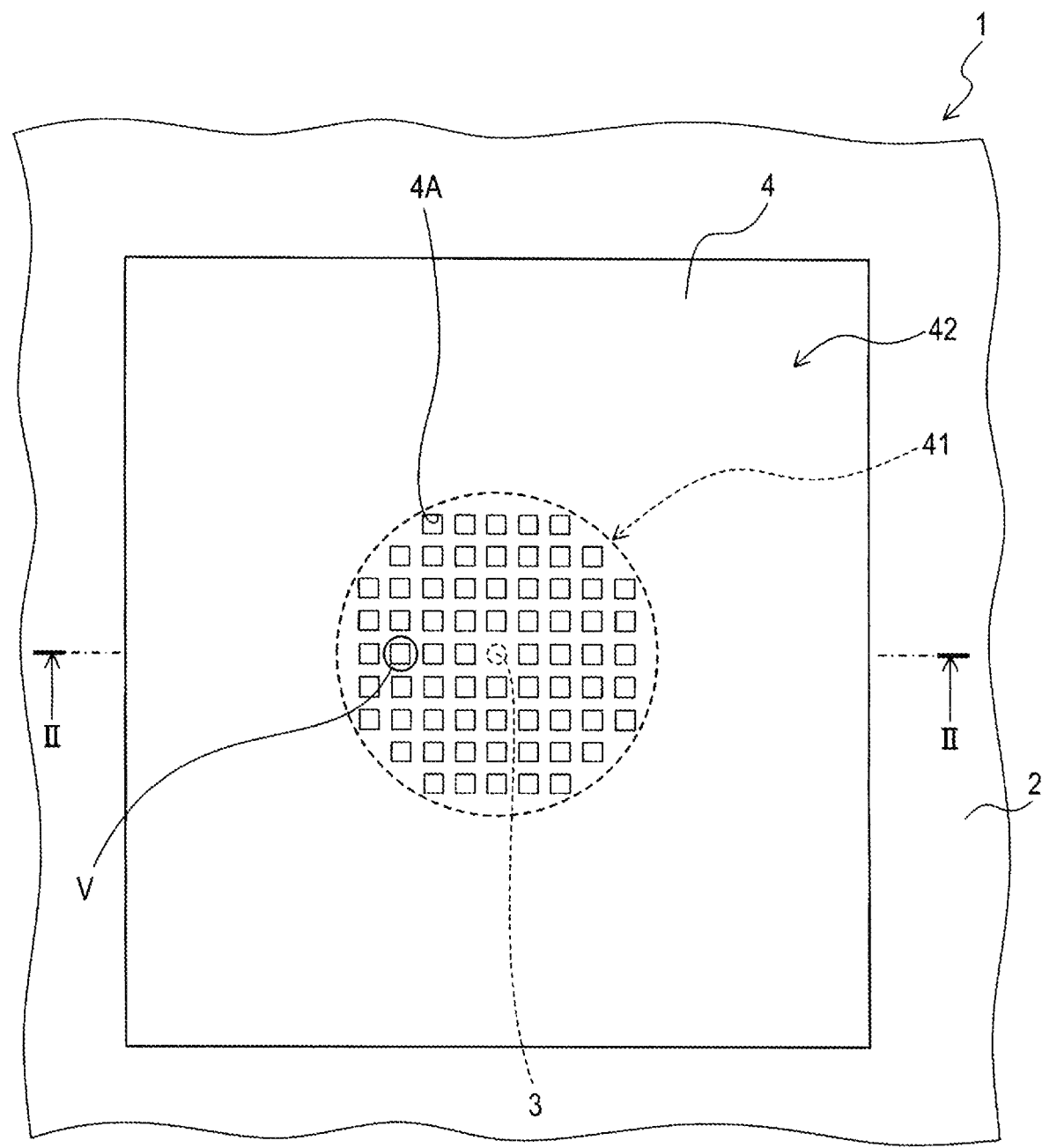
FIG. 1 is a partial plan view of a wiring board according to an embodiment of the present disclosure.

The following describes embodiments of the present disclosure, referring to the drawings.

[First Embodiment] As shown in FIG. 1, a wiring board 1 includes a ceramic board 2 and an electrode pad 4. Although the electrode pad 4 is one in number in FIG. 1, the wiring board 1 may include a plurality of the electrode pads 4.

The wiring board 1 according to the present embodiment serves as, for example, a wiring board for a probe card used in electrical inspection of a wafer including semiconductors. The probe card wiring board is provided with probes mounted thereto upon the inspection of wafer.

Figure 2:
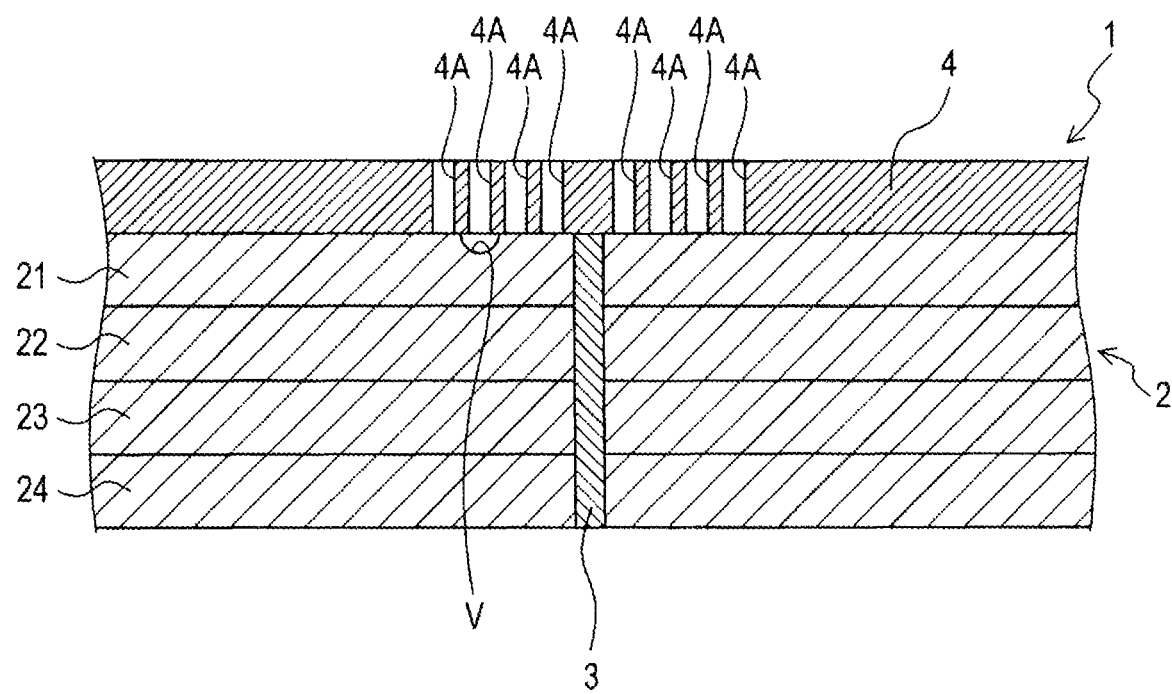
FIG. 2 is a partial cross-sectional view of the wiring board along a line II-II in FIG. 1.

<Ceramic Board> As shown in FIG. 2, the ceramic board 2 includes insulator layers 21, 22, 23, and 24 composed mainly of ceramic, and wiring (not shown) formed in these insulator layers.

The main component mentioned above means a component accounting 90% in mass. Incidentally, although the insulator layers are four in number in FIG. 2, the number is not limited to four, but may be one.

The wiring of the ceramic board 2 includes: wiring patterns formed such that each of the insulator layers has in its surface, at least one of the wiring patterns; and a conductor 3 (a via) extending through the insulator layers in their thickness direction. Although the conductor 3 is one in number in FIG. 2, the ceramic board 2 may include a plurality of the conductors 3.

The wiring of the ceramic board 2 is made of metal such as tungsten (W), molybdenum (Mo), manganese (Mn), copper (Cu), silver (Ag), and alloy of these metals. Tungsten is especially preferable in view of heat resistance during firing.

Each of the insulator layers is formed by firing a ceramic green sheet, and may include in its surface a void V formed due to expansion and contraction of ceramic upon firing. The void V is a depression in the thickness direction of the insulator layers, and is exposed on a surface of the each of the insulator layers: especially, on a surface of the ceramic board 2. The void V has a maximum width of approximately 30 μm in planar view.

The ceramic insulator layers may be made of any kind of ceramic such as alumina, low temperature co-fired ceramic (LTCC), and middle temperature co-fired ceramic (MTCC). LTCC is especially preferable.

Employment of LTCC serves to reduce a temperature for firing the ceramic board 2, and allows copper alloy such as Cu—W to be employed for the wiring of the ceramic board 2. This serves to reduce a production cost of the ceramic board 2 and improve the wiring in conductivity. On the other hand, LTCC tends to undergo comparatively large expansion and contraction upon firing, and is likely to include a void. The present disclosure serves to suppress the electrode pad 4 from undergoing the bulge, owing to through holes 4A described below.

<Electrode Pad> The electrode pad 4 is electrically connected to the conductor 3, and is disposed on the surface of the ceramic board 2: in other words, on a surface of the insulator layer 21 being an outmost layer of the ceramic board 2.

The electrode pad 4 is stacked on the surface of the ceramic board 2 so as to overlap with the conductor 3 exposed on the surface of the ceramic board 2. The electrode pad 4 is formed to be larger in area than a cross section of the conductor 3 at the surface of the ceramic board 2, in view of positional displacement in a surface direction due to the expansion and contraction of the ceramic board 2. The electrode pad 4 has an average thickness approximately between 1 μm and 20 μm.

The electrode pad 4 includes the through holes 4A extending through the electrode pad 4 in its thickness direction, such that the through holes 4A do not overlap with the conductor 3 in a thickness direction of the ceramic board 2: namely, in the thickness direction of the insulator layers 21, 22, 23, and 24. In other words, each of the through holes 4A is positioned to avoid overlapping with the conductor 3 in the thickness direction of the ceramic board 2. In addition, each of the through holes 4A extends to reach the surface of the ceramic board 2. Accordingly, the surface of the ceramic board 2 is exposed to outside at some portions that overlap with the through holes 4A and are not covered by the electrode pad 4.

In case that the void V is formed to overlap with one of the through holes 4A in the thickness direction of the insulator layers, the void V is allowed to communicate with outside of the electrode pad 4 via the one of the through holes 4A, and discharge gas produced in the void V to the outside of the electrode pad 4 via the one of the through holes 4A.

As shown in FIG. 1, the electrode pad 4 further includes a central part 41 in which the through holes 4A are formed, and a peripheral part 42 surrounding the central part 41 without involving the through holes 4A.

The central part 41 involves a center such as a geometrical center of the electrode pad 4 in planar view (specifically, view in a thickness direction of the electrode pad 4), and spreads to overlap with the conductor 3. According to the present embodiment, the central part 41 is exemplified to be a circular part centered at the center of the electrode pad 4.

The central part 41 has a width that is defined as a diameter of a minimum circle enclosing the central part 41 and is suitably set depending on a diameter of the conductor 3 and on a size and an expansion/contraction rate of the ceramic board 2. The peripheral part 42 is a part out of the central part 41 in planar view of the electrode pad 4, and includes an outer edge of the electrode pad 4.

According to the present embodiment, the through holes 4A have a same shape, and are arranged in grid at equal intervals in the central part 41: in other words, arranged to be aligned lengthwise and breadthwise at equal intervals. As shown in FIG. 1, the central part 41 includes at its center a portion in which none of the through holes 4A is formed, for increasing the central part 41 in area in connection with the conductor 3. Incidentally, the through holes 4A may be arranged in zigzag, for example.

Each of the through holes 4A is preferred to have quadrangular openings as shown in FIG. 1, although a shape of the openings are not limited to a quadrangle but may be another such as a circle and a polygon except for quadrangle. Forming the through holes 4A to have the quadrangular openings serves to reduce an area among the through holes 4A arranged at equal intervals. This facilitates forming the through holes 4A to overlap with the void V, while suppressing the through holes 4A from increasing in size.

In case that the through holes 4A have the quadrangular openings, each quadrangle is preferred to be approximately between 5 μm and 80 μm in length of sides. In case that the through holes 4A have circular openings, each circle is preferred to have a diameter approximately between 5 μm and 80 μm.

Forming the through holes 4A smaller than a level increases a risk that none of the through holes 4A overlaps with the void V. Forming the through holes 4A larger than a level increases a risk that the electrode pad 4 and the insulator layer 21 become insufficient in strength of joint therebetween.

An interval D between the through holes 4A is preferred to be approximately between 10 μm and 25 μm. Setting the interval D smaller than a level increases the risk that the electrode pad 4 and the insulator layer 21 become insufficient in strength of joint therebetween. Setting the interval D larger than a level increases the risk that none of the through holes 4A overlaps with the void V.

The electrode pad 4 includes a base layer and a coat layer. The base layer is made of metal such as W, Mo, Mn, Cu, Ag, and alloy of these metals. The coat layer is made of metal such as nickel (Ni) and gold (Au). For example, the electrode pad 4 may be formed by coating an electrode of Cu with Ni and Au.

The through holes 4A can be formed by semi-additive method, for example. This is specifically implemented by: applying masks corresponding to the through holes 4A onto the base layer of the electrode pad 4; forming the coat layer on the base layer by plating; and removing portions of the base layer which correspond to the through holes 4A, by etching.

The wiring board 1 according to the above embodiment serves to produce the following beneficial effects.

(1a) The electrode pad 4 including the through holes 4A allows the gas produced by the vaporization of residue in the void V, to be discharged via one of the through holes 4A overlapping with the void V. This serves to suppress the electrode pad 4 from undergoing the bulge through the heating process, and thereby improve the wiring board 1 in reliability of connection involving the electrode pad 4.

(1b) The electrode pad 4 including the central part 41 and the peripheral part 42 serves to suppress the bulge from occurring in the central part 41 contributing to the connection between the electrode pad 4 and the conductor 3, and simultaneously improve the electrode pad 4 in strength of joint with the insulator layer 21 in the peripheral part 42.

[Other Embodiments] The present disclosure is not limited to the embodiment described above, but may be implemented by various embodiments.

(2a) For example, the wiring board 1 may further include a resin board including a resin insulator layer composed mainly of resin, wherein the resin board is stacked with the ceramic board 2.

(2b) The electrode pad 4 may be configured without the peripheral part 42. In other words, the through holes 4A may be formed over the whole part of the electrode pad 4 in planar view.

Figure 3:
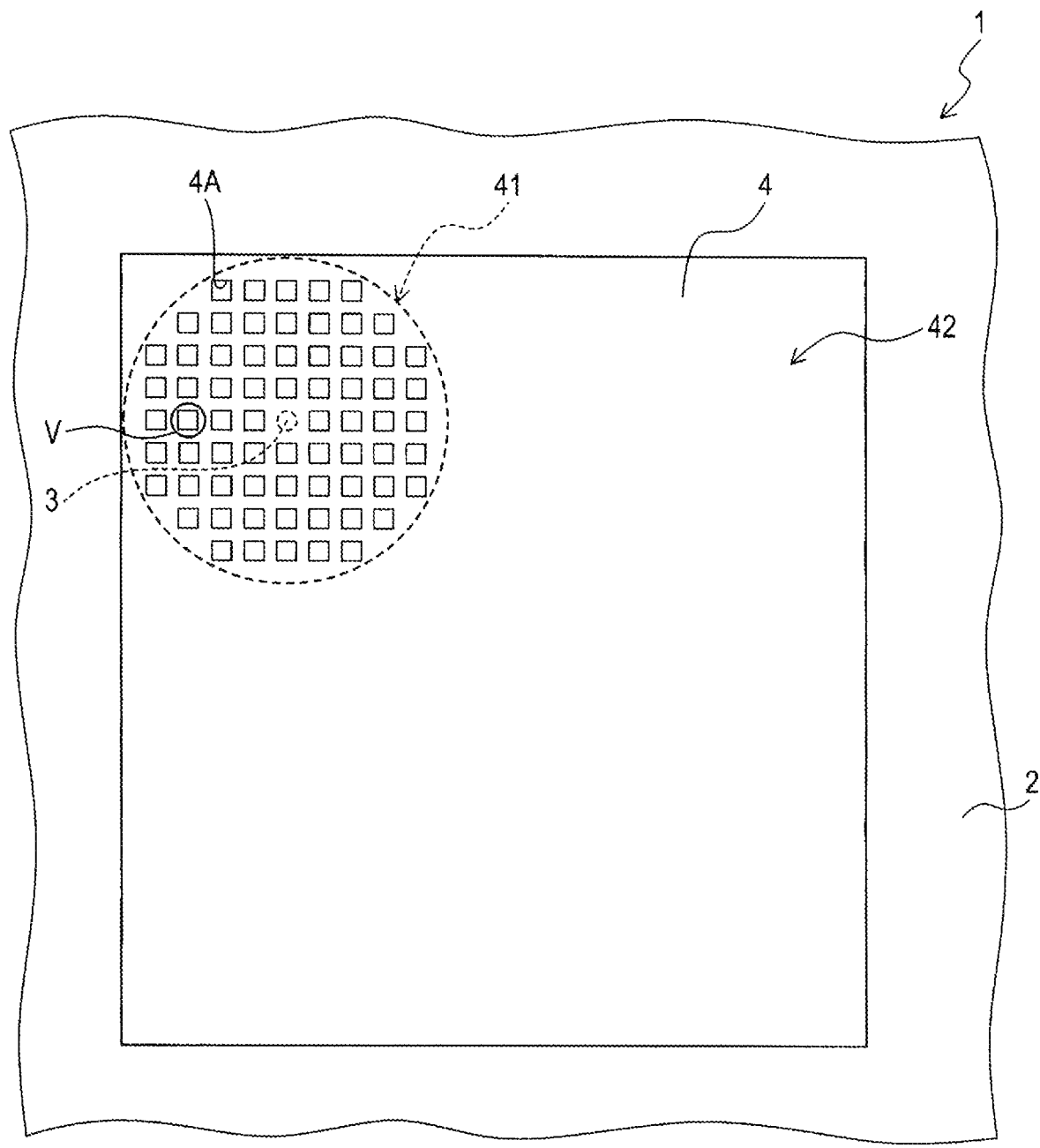
FIG. 3 is a partial plan view of a wiring board according to another embodiment of the present disclosure.
Figure 4:
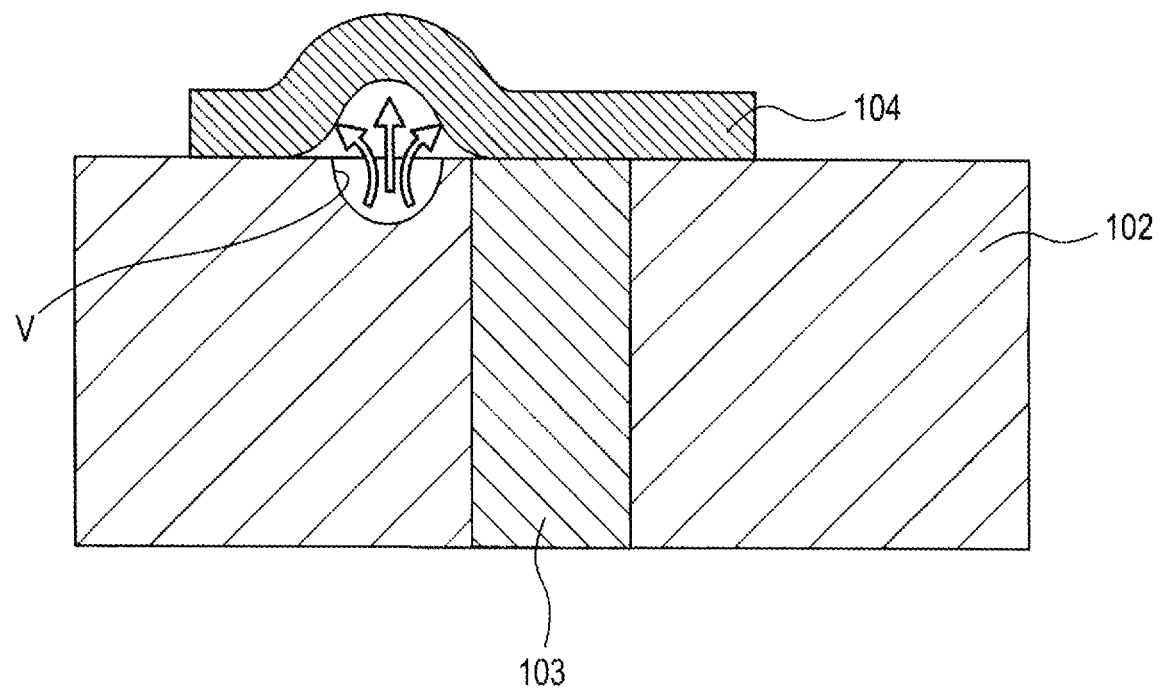
FIG. 4 is a schematic cross-sectional view of a conventional wiring board.

(2c) The conductor 3 and the through holes 4A may be located to avoid the center of the electrode pad 4. For example, as shown in FIG. 3, the conductor 3 and the through holes 4A (namely, the central part 41) may be located at a corner of the electrode pad 4. Thus-forming the through holes 4A at the corner serves to suppress a terminal of a probe etc. from being caught in the through holes 4A upon joining the terminal to the center of the electrode pad 4, and thereby suppress a fault from occurring upon installation of the terminal.

(2d) The embodiments described above may be modified by: replacing one of the components with a combination of components serving the same function; replacing some of the components with an integrated component serving the same functions; omitting some of the features; adding some of the features of another one of the embodiments; and/or replacing the features with some of the features of another one of the embodiments. The present disclosure may be implemented by any embodiments based on technical ideas defined by the following claims.

EXAMPLES

The following describes methods and results of tests that were implemented for confirming the beneficial effects of the embodiments of the present disclosure.

Example 1

Samples 1, 2, and 3 were prepared such that each of them included a ceramic board and a plurality of the electrode pads 4 formed on the ceramic board. Each of the electrode pads 4 was formed according to the first embodiment as shown in FIG. 1, and was sized such that: a length of each side of the electrode pad 4 in planar view was 920 µm; a thickness of the electrode pad 4 was 16 µm; the interval D between the through holes 4A was 20 µm; and the width of the central part 41 was 350 µm.

Each of the through holes 4A was formed to have sides of: 25 µm in the sample 1; 21 µm in the sample 2; and 17 µm in the sample 3. The samples 1, 2, and 3 were heated at 330° C. and checked for the bulge in the electrode pad 4. As a result, none of the samples included the bulge in the electrode pad 4.

Example 2

Samples 4, 5, and 6 were prepared such that each of them included a ceramic board and a plurality of the electrode pads 4 formed on the ceramic board, wherein each of the electrode pads 4 was same in size with that of the example 1, except for the thickness of the electrode pads 4 which was set to 5 µm.

Each of the through holes 4A was formed to have sides of: 25 µm in the sample 4; 21 µm in the sample 5; and 17 µm in the sample 6. The samples 4, 5, and 6 were heated at 330° C. and checked for the bulge in the electrode pad 4. As a result, none of the samples included the bulge in the electrode pad 4.

Comparative Example 1

A sample 7 was prepared to include a ceramic board and a plurality of the electrode pads 4 formed on the ceramic board, wherein each of the electrode pads 4 was same in size with that of the example 1, and included no through hole. The sample 7 was heated at 330° C. and checked for the bulge in the electrode pad 4. As a result, the electrode pads 4 of the sample 7 included the bulge at a rate of 0.04%.

Comparative Example 2

A sample 8 was prepared to include a ceramic board and a plurality of the electrode pads 4 formed on the ceramic board, wherein each of the electrode pads 4 was same in size with that of the example 2, and included no through hole. The sample 8 was heated at 330° C. and checked for the bulge in the electrode pad 4. As a result, the electrode pads 4 of the sample 8 included the bulge at a rate of 1.6%.

<Considerations> The above results of the examples 1 and 2 and the comparative examples 1 and 2 show that the through holes serve to suppress the electrode pad from undergoing the bulge. The above results also show that the bulge is more likely to occur in a thinner electrode pad, and the through holes serve to suppress the bulge from occurring, more effectively for the thinner electrode pad.

The following summarizes features of the above embodiments.

A wiring board (1) includes: an insulator layer (21) composed mainly of ceramic; a conductor (3) extending through the insulator layer (21) in a thickness direction thereof; and an electrode pad (4) disposed on a first surface of the insulator layer (21) and connected electrically with the conductor (3), wherein: the electrode pad (4) includes through holes (4A) extending through the electrode pad (4) in a thickness direction thereof; and each of the through holes (4A) is positioned to avoid overlapping with the conductor (3) in the thickness direction of the insulator layer (21).

This configuration allows gas produced by vaporization of residue in a void (V) formed in a surface of the insulator layer (21), to be discharged via one of the through holes (4A) overlapping with the void (V). This serves to suppress the electrode pad (4) from undergoing a bulge through a heating process, and thereby improve the wiring board (1) in reliability of connection involving the electrode pad (4).

According to one aspect of the present disclosure, the electrode pad (4) further includes: a central part (41) in which the through holes (4A) are formed; and a peripheral part (42) surrounding the central part (41) without involving the through holes (4A).

This configuration serves to suppress the bulge from occurring in the central part (41) contributing to the connection between the electrode pad (4) and the conductor (3), and simultaneously improve the electrode pad (4) in strength of joint with the insulator layer (21) in the peripheral part (42).

According to another aspect of the present disclosure, each of the through holes (4A) has quadrangular openings.

This configuration serves to reduce an area among the through holes (4A), in case that the through holes (4A) are arranged at equal intervals. This facilitates forming the through holes (4A) to overlap with the void (V), while suppressing the through holes (4A) from increasing in size.

According to still another aspect of the present disclosure, the insulator layer (21) is composed mainly of low temperature co-fired ceramic.

This configuration serves to effectively suppress the electrode pad (4) from undergoing the bulge, in the wiring board (1) employing the low temperature co-fired ceramic that tends to undergo comparatively large expansion and contraction upon firing and is likely to include a void.

According to still another aspect of the present disclosure: the insulator layer (21) includes a void (V) exposed on the first surface of the insulator layer (21); and one of the through holes (4A) is formed to overlap with the void (V) in the thickness direction of the insulator layer (21).

This configuration serves to efficiency discharge the gas produced in the void (V) to outside of the electrode pad (4) via the through holes (4A).

The entire contents of Japanese Patent Applications 2018-208186 filed Nov. 5, 2018 and 2019-076507 filed Apr. 12, 2019 are incorporated herein by reference.

The invention claimed is:

1. A wiring board comprising:
an insulator layer composed mainly of ceramic;
a conductor extending through the insulator layer in a thickness direction thereof; and
an electrode pad disposed on a first surface of the insulator layer and connected electrically with the conductor,
wherein:

the electrode pad includes through holes extending through the electrode pad in a thickness direction thereof;

each of the through holes is positioned to avoid overlapping with the conductor in the thickness direction of the insulator layer;

the through holes are arranged at intervals between 10 μm and 25 μm;

the insulator layer includes a void exposed on the first surface of the insulator layer; and one of the through holes is formed to overlap with the void, as viewed in the thickness direction of the insulator layer.

2. The wiring board according to claim 1, wherein the electrode pad further includes:

a central part in which the through holes are formed; and a peripheral part surrounding the central part without involving the through holes.

3. The wiring board according to claim 1, wherein each of the through holes has quadrangular openings.

4. The wiring board according to claim 1, wherein the insulator layer is composed mainly of low temperature co-fired ceramic.

\* \* \* \* \*